United States Patent
Aoki et al.

(10) Patent No.: US 9,822,235 B2
(45) Date of Patent: Nov. 21, 2017

(54) GLASS-CONTAINING THERMOPLASTIC ACRYLIC RESIN COMPOSITION AND MOLDED ARTICLE THEREOF

(75) Inventors: Yutaka Aoki, Otake (JP); Hiroshi Niino, Otake (JP)

(73) Assignee: Mitsubishi Chemical Corporation, Tokyo (JP)

( * ) Notice: Subject to any disclaimer, the term of this patent is extended or adjusted under 35 U.S.C. 154(b) by 875 days.

(21) Appl. No.: 13/976,549

(22) PCT Filed: Jan. 6, 2012

(86) PCT No.: PCT/JP2012/050161
§ 371 (c)(1),
(2), (4) Date: Jun. 27, 2013

(87) PCT Pub. No.: WO2012/093717
PCT Pub. Date: Jul. 12, 2012

(65) Prior Publication Data
US 2013/0281601 A1    Oct. 24, 2013

(30) Foreign Application Priority Data

Jan. 7, 2011 (JP) .................... 2011-001906
Aug. 10, 2011 (JP) .................... 2011-174494

(51) Int. Cl.
| | | |
|---|---|---|
| C08K 3/40 | (2006.01) | |
| H01L 31/04 | (2014.01) | |
| C08L 33/12 | (2006.01) | |
| H01L 31/048 | (2014.01) | |

(52) U.S. Cl.
CPC ............. *C08K 3/40* (2013.01); *C08L 33/12* (2013.01); *H01L 31/0481* (2013.01); *C08K 2201/016* (2013.01); *Y02E 10/50* (2013.01)

(58) Field of Classification Search
CPC . C08K 3/40; C08K 2201/016; H01L 31/0481; C08L 33/12; Y02E 10/50
USPC ........................................................ 524/494
See application file for complete search history.

(56) References Cited

U.S. PATENT DOCUMENTS

2008/0071020 A1*  3/2008  Kobayashi ............ C08K 7/00
                                                    524/494

FOREIGN PATENT DOCUMENTS

| JP | 61-101546 A | 5/1986 |
|---|---|---|
| JP | 05-140440 A | 6/1993 |
| JP | 08-208935 A | 8/1996 |
| JP | 2000-347008 A | 12/2000 |
| JP | 2001-089616 A | 4/2001 |
| JP | 2004-231934 A | 8/2004 |
| JP | 2005-015624 A | 1/2005 |
| JP | 2005-126676 A | 5/2005 |
| JP | 2005-132894 A | 5/2005 |
| JP | 2006-249291 A | 9/2006 |
| JP | 2007-077385 A | 3/2007 |
| JP | 2007-206197 A | 8/2007 |
| JP | 2008-045040 A | 2/2008 |
| JP | 2008-074927 A | 4/2008 |
| JP | 2010-150491 A | 7/2010 |
| JP | 2010-270183 A | 12/2010 |

OTHER PUBLICATIONS

English language machine translation of JP 2007-077385, Mar. 2007.*
International Search Report dated Apr. 10, 2012 for International application No. PCT/JP2012/050161.

* cited by examiner

*Primary Examiner* — Angela C Scott
(74) *Attorney, Agent, or Firm* — Morgan, Lewis & Bockius LLP

(57) ABSTRACT

A thermoplastic acrylic resin composition is provided in which translucency properties are suitable for use as a top-sheet member of a photovoltaic cell, warping caused by temperature change is suppressed, and its weathering resistance is excellent; 0.1 to 50 parts by mass of a glass is contained in 100 parts by mass of the thermoplastic acrylic resin; an absolute value of a difference in refractive indices of the thermoplastic acrylic resin and the glass is 0.08 or lower; an average particle size of the glass is 100 to 2,000 μm; a softening temperature of the thermoplastic resin is 80° C. or higher; and the aspect ratio of the glass is 15 or greater. Also, a molded article which is obtained by molding the thermoplastic acrylic resin composition and has a YI value of 20 or lower after weathering-resistance testing. Further, a top-sheet member of a photovoltaic cell is made of the molded article.

2 Claims, No Drawings

GLASS-CONTAINING THERMOPLASTIC ACRYLIC RESIN COMPOSITION AND MOLDED ARTICLE THEREOF

TECHNICAL FIELD

The present invention relates to a thermoplastic acrylic resin composition containing glass with a predetermined average particle size and to a molded article obtained by molding such a thermoplastic acrylic resin composition. The present application claims priority based on Japanese patent application No. 2011-001906, filed Jan. 7, 2011, and No. 2011-174494, filed Aug. 10, 2011. The contents of the application are incorporated herein by reference in their entirety.

BACKGROUND ART

Glass material is used for top-sheet members for photovoltaic cells. Glass top-sheet members are excellent in dimensional stability and are flame retardant, but there is a limit to make them lightweight, and photovoltaic modules may be damaged when impact is exerted thereon. Thus, it has been studied to replace conventional glass top-sheet members with top-sheet members that are made from a composite using resin as the matrix material.

When top-sheet members are replaced with a composite, it is necessary to keep translucency characteristics of the composite at substantially the same level as that of the matrix resin so that the photoelectric conversion efficiency of photovoltaic cells is maintained. In addition, when a composite is used as a top sheet of a photovoltaic cell the top sheet, an encapsulant and a photovoltaic cell need to be thermally laminated. However, since an approximate temperature of 150° C. is added during the lamination process, it is necessary to suppress thermal expansion and to secure stiffness of the top sheet. Having low-quality properties is not preferred, since photovoltaic cells may warp or be damaged.

To obtain resin material with excellent translucency characteristics, a method is known such as dispersing translucent particles, fibers or the like in translucent matrix resin so as to adjust differences in refractive indices between the matrix resin and particles.

For example, patent publication 1 proposes a method for dispersing glass fiber or fine particles in translucent resin so as to achieve the difference in their refractive indices at 0.01 or lower. However, cured resin is used as the translucent resin in the method. When a composite is formed prior to curing the resin, sedimentation of glass material occurs due to the difference in specific gravities between the resin and glass material, and it is difficult to have homogeneously dispersed glass in the cured material when forming a thick molded article. It was especially difficult using fine-particle or flake-type glass material to produce a thick molded article in which glass material is homogeneously dispersed.

Also, patent publication 2 proposes a method for dispersing glass flakes with an average particle size of 5 to 50 μm in thermoplastic resin. However, since the average particle size of the glass in the method is small, the obtained molded article does not have sufficient translucency characteristics.

Patent publication 3 proposes a method for dispersing glass beads with an average particle size of 1 to 10 μm in thermoplastic resin. However, since the glass used in the method is sphere-shaped with a small average particle size, multiple scattering tends to occur and translucency characteristics may decrease in the molded article to be obtained.

Patent publication 4 discloses a composition containing rubber-reinforced polystyrene resin serving as a matrix and glass flakes or mica dispersed therein. However, the rubber dispersed in the matrix causes higher thermal expansion and reduced stiffness. Thus, it is not sufficient for use as a top sheet of a photovoltaic cell. In addition, regarding the materials disclosed in examples of patent publication 4, the total light transmission is approximately 70% at the maximum, and translucency characteristics are not sufficient.

In addition, patent publication 5 proposes a composite of an aromatic polycarbonate resin and glass flakes or glass fiber whose refractive index has a difference of 0.015 or lower from that of the aromatic polycarbonate resin. Such a composition has sufficient stiffness and translucency properties, but its weathering resistance is not sufficient because of the aromatic polycarbonate used as matrix material.

PRIOR ART DOCUMENTS

Patent Documents

Patent Publication 1: Japanese Laid-Open Patent Publication No. 2004-231934
Patent Publication 2: Japanese Laid-Open Patent Publication No. 2008-074927
Patent Publication 3: Japanese Laid-Open Patent Publication No. 2000-347008
Patent Publication 4: Japanese Laid-Open Patent Publication No. 2005-132894
Patent Publication 5: Japanese Laid-Open Patent Publication No. 2006-249291

DISCLOSURE OF THE INVENTION

Problems to be Solved by the Invention

The objective of the present invention is to provide a thermoplastic acrylic resin composition which has excellent translucency characteristics and weathering resistance, and which suppresses warping caused by temperature change.

Means for Solving the Problems

The inventors of the present invention have conducted intensive studies, and found that when a thermoplastic acrylic resin is compounded with a type of glass having a predetermined average particle size and a refractive index with a predetermined difference from the index of the thermoplastic acrylic resin as the matrix, the thermoplastic acrylic resin composition is excellent in translucency characteristics and weathering resistance, and suppresses warping caused by temperature change.

Namely, an embodiment of the present invention, a thermoplastic acrylic resin composition, having: a thermoplastic acrylic resin (A); and a glass (B), wherein 0.1 to 50 parts by mass of the glass (B) are contained in 100 parts by mass of the thermoplastic acrylic resin (A), an absolute value of a difference in refractive indices of the thermoplastic acrylic resin (A) and the glass (B) is 0.08 or lower, an average particle size of the glass (B) is 100 to 2,000 μm, and a softening temperature of the thermoplastic acrylic resin composition measured by ASTM D648 is 80° C. or higher. The Glass (B) is preferred to be flakes with an aspect ratio of 15 or greater. Also, the present invention relates to a molded article obtained by molding the above thermoplastic acrylic resin composition.

In addition, the present invention relates to a top-sheet member of photovoltaic cells. The YI value (yellow index) of such a top-sheet member is 20 or lower after weathering-resistance testing using the above molded article.

Moreover, the present invention relates to a photovoltaic module using the molded article described above.

Effects of the Invention

The thermoplastic acrylic resin composition according to an embodiment of the present invention provides a molded article which has excellent translucency characteristics and weathering resistance, and which is less likely to warp when temperature changes.

Since the molded article according to an embodiment of the present invention has excellent translucency characteristics and weathering resistance and its warping is suppressed when temperature changes, it is suitable for a top-sheet member of a photovoltaic cell.

BEST MODE FOR CARRYING OUT THE INVENTION

Thermoplastic acrylic resin (A) used in an embodiment of the present invention is not limited to any specific type as long as it is a translucent thermoplastic acrylic resin.

Acrylic resins and styrene copolymers (MS resins) are listed for a thermoplastic acrylic resin (A), for example. Such resins may be used alone, or two or more kinds may be used together.

Among those, acrylic resins and MS resins are preferred since it is easier to adjust the absolute value of the difference in refractive indices with glass (B) at 0.08 or lower. Acrylic resins are more preferred.

Acrylic resins above are well-known types of resins, and they are obtained by polymerizing (meth)acrylates.

The following are listed as (meth)acrylates: methyl (meth)acrylate, ethyl (meth)acrylate, butyl (meth)acrylate, cyclohexyl (meth)acrylate, phenyl (meth)acrylate, benzyl (meth)acrylate, 2-ethylhexyl (meth)acrylate, 2-hydroxyethyl (meth)acrylate and (meth)acrylic acid. Those may be used alone, or two or more kinds may be used together. Among those, methyl (meth)acrylate is preferred.

Because light transmission, heat resistance, mechanical properties, moldability and weathering resistance are excellent, a resin containing 10 to 100% by mass of a methyl methacrylate unit is preferred; and a resin containing 50 to 100% by mass of a methyl methacrylate unit is more preferred.

From the viewpoints of maintaining its excellent optical properties and light resistance, a resin containing 10% by mass or greater of a methyl methacrylate unit is preferred to be made up of 10 to 100% by mass of a methyl methacrylate unit and 0 to 90% by mass of another monomer unit, more preferably 50 to 100% by mass of a methyl methacrylate unit and 0 to 50% by mass of another monomer unit, and even more preferably 70 to 100% by mass of a methyl methacrylate unit and 0 to 30% by mass of another monomer unit.

Regarding other monomers as materials for another monomer unit, the following are listed, for example: acrylates such as methyl acrylate, ethyl acrylate, butyl acrylate, cyclohexyl acrylate, phenyl acrylate, benzyl acrylate, and 2-ethylhexyl acrylate; methacrylates such as ethyl methacrylate, butyl methacrylate, cyclohexyl methacrylate, phenyl methacrylate and benzyl methacrylate; vinyl acetate; aromatic vinyl monomers such as styrene, p-methylstyrene, α-methylstyrene and vinylnaphthalene; vinyl cyanide monomers such as acrylonitrile and methacrylonitrile; α, β-unsaturated carboxylic acids such as acrylic acid, methacrylic acid and crotonic acid; and maleimide compounds such as N-ethylmaleimide and N-cyclohexyl maleimide.

Those may be used alone, or two or more kinds may also be compounded.

Regarding the molecular weight of thermoplastic acrylic resin (A), the mass-average molecular weight measured using GPC is preferred to be 50,000 to 200,000, and more preferably, 60,000 to 150,000 for material to be molded by heating and melting.

When the mass-average molecular weight of thermoplastic acrylic resin (A) is 50,000 or more, the strength and durability of the molded article improve, and when it is 200,000 or less, moldability such as fluidity is enhanced.

The average particle size of glass (B) to be used in the present embodiment is 100 to 2,000 μm, preferably 100 to 500 μm, and more preferably, 150 to 450 μm. Here, average particle sizes of glass (B) indicate values measured using a particle size analyzer (LA-910, made by Horiba, Ltd.).

When the average particle size of glass (B) is 100 μm or greater, the translucency characteristics of a molded article are excellent, and when it is 2,000 μm or smaller, moldability is enhanced.

As for glass (B), glass fillers such as glass beads, glass fine particles, glass flakes and chopped strands are preferred. Among those, glass flakes in a scaly shape are especially preferred. In particular, the aspect ratio of glass (B) is preferred to be 15 or greater, 15 to 1,000 is more preferable, and 40 to 100 is even more preferable.

When the aspect ratio of glass (B) is 15 or greater, the translucency characteristics of a molded article are excellent, and when it is 1,000 or smaller, moldability is enhanced, and thus dispersing glass (B) homogeneously in a matrix resin is not difficult.

Aspect ratios were obtained when the values of average particle sizes above were divided by the value of the average thickness of glass (B). The average thickness of glass (B) was obtained by measuring 30 units of glass (B) using a digital microscope, KH-3000 made by Hirox, Inc. and by calculating a simple average.

Types of glass (B) are as follows, for example: E-glass, C-glass. A-glass, S-glass, D-glass, NE-glass, T-glass, quartz, low dielectric glass and high dielectric glass.

Commercially available glass flakes, for example, "GLASFLAKE" made by Nippon Sheet Glass Co., Ltd., may be used for glass (B).

A thermoplastic acrylic resin composition of the present embodiment contains 0.1 to 50 parts by mass of glass (B) based on 100 parts by mass of thermoplastic acrylic resin (A). In addition, 5 to 45 parts by mass of glass (B) based on 100 parts by mass of thermoplastic acrylic resin (A) are preferred to be contained.

When 0.1 parts by mass or more of glass (B) based on 100 parts by mass of thermoplastic acrylic resin (A) are contained, the translucency characteristics of a molded article are excellent; and when 50 parts by mass or less are contained, moldability does not decrease.

The absolute value of the difference in refractive indices between thermoplastic acrylic resin (A) and glass (B) is preferred to be 0.08 or lower, which leads to excellent translucency characteristics.

A thermoplastic acrylic resin composition of the present embodiment is prepared by compounding and melt-blending thermoplastic acrylic resin (A) and glass (B) using a preliminary mixer such as a ribbon blender, tumbler, Nauta mixer, Henschel mixer, super mixer or planetary mixer; and a melt-blending apparatus such as a Bunbury mixer, kneader, roller, Kneader Ruder, single-screw extruder or twin-screw extruder.

In addition, well-known stabilizers, additives or the like may be added to the thermoplastic acrylic resin composition if necessary.

When each raw material is supplied to a melt-blending apparatus, it is preferred to compound materials in advance and supply them to the apparatus. However, it is also an option to supply each material separately into a melt-blending apparatus. The size of pellets obtained after melt-blending is preferred to be 1 to 10 mm, more preferably 1 to 5 mm, from the viewpoints of the ease of handling and processing, A molded article according to the present embodiment is obtained by molding the thermoplastic acrylic resin composition by a method such as injection molding, extrusion molding, compression molding or the like. Among those, injection molding or extrusion molding is preferred because a desired shape can be molded.

As for a method for forming a sheet-type or film-type molded article through extrusion molding, for example, the melted resin extruded by an extruder using a T-die or the like is hauled off while it is cooled by a cooling roll.

A molded article according to an embodiment of the present invention is suitable for a top-sheet member of photovoltaic cells because it has excellent translucency characteristics and weathering resistance, and warping caused by temperature change is less likely to occur.

EXAMPLES

In the following, the present invention is described in detail by examples. However, the present invention is not limited to such examples.

"Parts" and "%" in examples mean "parts by mass" and "% by mass" respectively.
(a) Total Light Transmission A haze meter (NDH 2000, made by Nippon Denshoku Industries, Co., Ltd.) with use of D65 light source was used to measure total light transmission (Tt) of test sheets before and after weathering-resistance tests. (Tt) is used as the index of translucency characteristics in the present embodiment.
(b) Refractive Index An Abbe refractometer (DR-A1, made by Atago Co., Ltd.) and sodium D lines were used to measure a refractive index of thermoplastic acrylic resin (A).
(c) Measuring Average Particle Size The average particle size (number-average particle size) of glass filler (B) was measured as follows: a solution was prepared by dispersing 10 mg of glass flakes in 5 mL of water, particle diameters were measured using a particle size analyzer (LA-910, made by Horiba, Ltd.), and the number-average value was calculated.
(d) Measuring Average Thickness A digital microscope, KH-3000, made by Hirox, Inc. was used to obtain the average thickness of glass filler (B) by measuring thicknesses of 30 units of glass filler (B) and by calculating the simple average.
(e) Light Resistance Using a metal weather tester, made by Daypla Wintes Co., Ltd. (model: KW-R5TP-A, light source: a water-cooled metal halide lamp), irradiation tests were conducted on test sheets prepared above using a filter KF-1 (wavelength of transmitted light 295 to 780 nm) under conditions of irradiance at 140 mW/cm$^2$, black panel temperature of 63° C., and spraying with water.
(f) YI Value (Yellow Index)

Based on JIS-K7105, the YI values of test sheets above were measured before and after weathering-resistance testing.
(g) Measuring Softening Temperature (HDT)

Using thermoplastic acrylic resin compositions obtained in their respective examples or comparative examples, test sheets (1 cm×8 cm×4 mm-thick) were produced through injection molding, and annealed at 80° C. for 24 hours. Then, their heat distortion temperatures were determined under a low load (4.6 kg/cm$^2$) based on ASTM D648.
(h) Warping in Photovoltaic Module On a hot plate of a photovoltaic module laminator (LM-50X50-S, made by NPC Inc.), the following were laminated in this order: a molded article obtained in each example or comparative example, 150 mm×150 mm of encapsulant (EVA, 0.45 mm thick, made by C.I. Kasei Co., Ltd.), single photovoltaic cells connected in series (5 inches, polycrystalline silicon photovoltaic cells, made by Asuden Co., Ltd.), and 150 mm×150 mm of encapsulant (EVA, 0.45 mm thick, made by C.I. Kasei Co., Ltd.), and 150 mm×150 mm of a lower-surface protective member. Then, the laminate was sandwiched by 500 mm×500 mm template film, and vacuum-pressed under conditions of vacuum atmosphere, 135 degrees, 15 minutes and pressure of 101.3 kPa. Accordingly, photovoltaic modules were obtained. Warping in each module was visually observed and evaluated as follows:
A: no warping observed in produced photovoltaic module
B: warping observed in produced photovoltaic module Example 1

Ten parts of glass (B) (brand name "RCF-600" made by Nippon Sheet Glass Co., Ltd., refractive index of 1.520, average particle size of 437 μm, aspect ratio of 67) are added to 100 parts of poly(methyl methacrylate) resin (brand name "VHK" made by Mitsubishi Rayon Co., Ltd., mass-average molecular weight of 95,000, monomer unit composition: methyl methacrylate 99%, methyl acrylate 1%) as thermoplastic acrylic resin (A), and dry-blended.

Next, using a single-screw extruder (30 mm φ single-screw extruder, made by TPIC Co., Ltd.) the resin is melt-kneaded at 250° C. and the extruded strands are cut into pellets. Accordingly, a thermoplastic acrylic resin composition is obtained.

The above thermoplastic acrylic resin composition was molded using an injection molding machine (brand name "IS100EN," made by Toshiba Machine Engineering Co., Ltd.) to obtain a 3 cm×3 cm×2 mm-thick sheet. The sheet was used as a test sheet. The evaluation results are shown in Table 1.

The refractive index, average particle size and aspect ratio of glass are shown in Table 1.

Examples 2-7, Comparative Examples 1-4

In the same manner described in example 1 except that the type of thermoplastic acrylic resin (A) and the type and amount of glass (B) were changed as shown in Table 1, molded articles were obtained respectively.
Resins:
BR-52: poly(methyl methacrylate/styrene) copolymer resin (brand name "BR-52" made by Mitsubishi Rayon Co., Ltd., mass-average molecular weight of 65,000, monomer unit composition: methyl methacrylate 75%, styrene 25%)
PS: polystyrene resin (brand name "Toyo Styrene GP G200C," made by Toyo Styrene Co., Ltd.)
PC: polycarbonate resin (brand name "Panlite L-1225 WS," made by Teijin Ltd.)
Glass (B):
glass flakes (brand name "RCF-2300," made by Nippon Sheet Glass Co., Ltd.)
glass flakes (brand name "RCF-I6Q," made by Nippon Sheet Glass Co., Ltd.)
glass flakes (brand name "RCF-15," made by Nippon Sheet Glass Co., Ltd.)
glass (hikes (brand name "REF-15," made by Nippon Sheet Glass Co., Ltd.)
The refractive indices, average particle sizes and aspect ratios of glass flakes are shown in Table 1.

INDUSTRIAL APPLICABILITY

A thermoplastic acrylic resin composition according to an embodiment of the present invention has excellent translucency characteristics and weathering resistance, and suppresses warping caused by temperature change. In addition, a molded article according to the embodiment of the present, invention is suitable for use as a top-sheet member of a photovoltaic cell since it has excellent translucency characteristics and weathering resistance, and warping caused by temperature change is less likely to occur.

The invention claimed is:
1. A thermoplastic acrylic resin composition, comprising:
   a thermoplastic acrylic resin (A); and
   a glass (B),
   wherein

TABLE 1

| | resin | | | glass flake | | | | difference in resin/glass flakes | before weather resistance test Tt (%) | after weather resistance test Tt (%) | before weather resistance test YI | after weather resistance test YI | HDT (° C.) | warping in photovoltaic module |
|---|---|---|---|---|---|---|---|---|---|---|---|---|---|---|
| | type | refractive index | [part] | type | refractive index | particle size | aspect ratio | [part] | refractive index | | | | | | |
| Example 1 | VHK | 1.492 | 100 | RCF-600 | 1.52 | 437 | 67 | 10 | 0.028 | 89 | 87 | 1.4 | 2.5 | 91 | A |
| Example 2 | VHK | 1.492 | 100 | RCF-2300 | 1.52 | 192 | 45 | 10 | 0.028 | 91 | 89 | 0.9 | 2.4 | 95 | A |
| Example 3 | VHK | 1.492 | 100 | RCF-160 | 1.52 | 356 | 76 | 10 | 0.028 | 92 | 90 | 0.8 | 2.2 | 93 | A |
| Example 4 | VHK | 1.492 | 100 | RCF-600 | 1.52 | 437 | 67 | 40 | 0.028 | 87 | 81 | 1.9 | 4 | 102 | A |
| Example 5 | VHK | 1.492 | 100 | RCF-2300 | 1.52 | 192 | 45 | 40 | 0.028 | 82 | 78 | 2.5 | 5.4 | 103 | A |
| Example 6 | VHK | 1.492 | 100 | RCF-160 | 1.52 | 356 | 76 | 40 | 0.028 | 87 | 79 | 1.6 | 3.7 | 103 | A |
| Example 7 | BR-52 | 1.514 | 100 | RCF-600 | 1.52 | 437 | 67 | 10 | 0.006 | 90 | 86 | 1.6 | 3.5 | 83 | A |
| Comparative Example 1 | VHK | 1.492 | 100 | RCF-15 | 1.52 | 57 | 13 | 40 | 0.028 | 60 | 59 | 7.4 | 11.4 | 99 | A |
| Comparative Example 2 | VHK | 1.492 | 100 | RCF-15 | 1.56 | 57 | 13 | 10 | 0.068 | 64 | 61 | 8.5 | 8.3 | 95 | A |
| Comparative Example 3 | PS | 1.594 | 100 | RCF-600 | 1.52 | 437 | 67 | 10 | 0.074 | 86 | 65 | 5.3 | 27.4 | 73 | B |
| Comparative Example 4 | PC | 1.582 | 100 | RCF-600 | 1.52 | 437 | 67 | 10 | 0.062 | 82 | 77 | 7.5 | 31.7 | 142 | A |

As shown in Table 1, in molded articles using thermoplastic acrylic resin compositions according to an embodiment of the present invention, it is found that translucency characteristics are excellent (higher (Tt)), softening temperature (HDT) is high at 80° C. or higher, hardly any warping occurs when photovoltaic modules are formed, and weathering resistance is excellent (examples 1 to 7).

Molded articles, formed using glass (B) with a smaller average particle size and a thermoplastic acrylic resin composition different from those in the above embodiment of the present invention, have lower translucency characteristics (comparative examples 1 and 2).

Since the thermoplastic acrylic resin composition of comparative example 3 has a low softening temperature (HDT) at lower than 80° C., warping occurred when a photovoltaic module was produced. Also, notable deterioration in optical characteristics was observed after weathering-resistance testing.

Since no thermoplastic acrylic resin was used in comparative example 4, its durability was low, with notable deterioration in optical characteristics observed after weathering-resistance testing.

the thermoplastic acrylic resin (A) containing 10 to 100% by mass of a methyl methacrylate unit,
the mass-average molecular weight of thermoplastic acrylic resin (A) measured using GPC is 50,000 to 200,000,
0.1 to 50 parts by mass of the glass (B) are contained in 100 parts by mass of the thermoplastic acrylic resin (A),
an absolute value of a difference of refractive indices of the thermoplastic acrylic resin (A) and the glass (B) is 0.08 or lower,
an average particle size of the glass (B) is 100 to 2,000 μm,
the glass (B) is a flake-type glass with an aspect ratio of 15 or greater, and
a softening temperature of the thermoplastic acrylic resin composition measured by ASTM D648 is 80° C. or higher.
2. A molded article obtained by molding the thermoplastic acrylic resin composition according to claim 1.

* * * * *